(12) United States Patent
Ravichandran et al.

(10) Patent No.: US 8,426,817 B2
(45) Date of Patent: Apr. 23, 2013

(54) MONODISPERSED AND SPHERICAL ZNS FOR NANO-GRAIN OPTICAL WINDOWS

(75) Inventors: Duraiswamy Ravichandran, College Station, TX (US); Devan Balachari, College Station, TX (US)

(73) Assignee: Texas Biochemicals, Inc., College Station, TX (US)

( * ) Notice: Subject to any disclaimer, the term of this patent is extended or adjusted under 35 U.S.C. 154(b) by 0 days.

(21) Appl. No.: 13/407,223

(22) Filed: Feb. 28, 2012

(65) Prior Publication Data

US 2012/0223230 A1     Sep. 6, 2012

Related U.S. Application Data

(60) Provisional application No. 61/464,281, filed on Mar. 2, 2011.

(51) Int. Cl.
*G01J 5/00* (2006.01)
*C09K 11/08* (2006.01)

(52) U.S. Cl.
USPC ................................ 250/338.1; 252/301.4 R

(58) Field of Classification Search ............... 250/330, 250/338.1, 340; 252/301.4 R, 301.4 S, 301.6 R, 252/301.6 S
See application file for complete search history.

(56) References Cited

U.S. PATENT DOCUMENTS

| | | | |
|---|---|---|---|
| 4,357,427 A | 11/1982 | Ho et al. | |
| 4,717,822 A | 1/1988 | Byren | |
| 4,864,137 A | 9/1989 | Klein | |
| 5,119,232 A | 6/1992 | Daley et al. | |
| 5,365,345 A | 11/1994 | Propst et al. | |
| 5,398,133 A | 3/1995 | Tsai et al. | |
| 5,488,371 A | 1/1996 | Targove | |
| 5,608,515 A | 3/1997 | Shu et al. | |
| 5,629,074 A | 5/1997 | Klocek et al. | |
| 5,643,505 A | 7/1997 | Harris et al. | |
| 5,658,504 A | 8/1997 | Shibata et al. | |
| 5,702,654 A | 12/1997 | Chen et al. | |
| 5,712,724 A | 1/1998 | Klocek et al. | |
| 5,786,287 A | 7/1998 | Bayya et al. | |
| 5,935,723 A | 8/1999 | Borden | |
| 6,144,031 A | 11/2000 | Herring et al. | |
| 6,287,478 B1 | 9/2001 | Klocek | |
| 6,592,798 B1 | 7/2003 | Omori et al. | |
| 7,808,632 B2 | 10/2010 | Vaidya et al. | |

OTHER PUBLICATIONS

Savage, J.A., "Infrared Optical Materials and Their Antireflection Coatings"; Adam Hilger Ltd, Bristol and Boston, 1985; pp. 95-111.
Block, S. et al.; Pressure Sintering and Transformation Toughening of Zinc Sulfide; Materials Science and Engineering, A127; 1990; pp. 99-104.
Yashina, E.V.; "Preparation and Properties of Polycrystalline ZnS for IR Applications"; Inorganic Materials, vol. 39, No. 7, 2003; pp. 663-668.

(Continued)

*Primary Examiner* — Mark R Gaworecki
(74) *Attorney, Agent, or Firm* — John A. Fortkort; Fortkort & Houston P.C.

(57) ABSTRACT

A method is provided for producing an article which is transparent to infrared radiation. The method includes the steps of (a) disposing a population of nanoparticles on a substrate, wherein the population of spherical nanoparticles has a population variance of less than 10% in at least one parameter selected from the group consisting of diameter and maximum dimension; (b) subjecting the nanoparticles to spark plasma sintering, thereby producing a sintered product; and (c) removing the sintered product from the substrate as a self-supporting mass.

20 Claims, 7 Drawing Sheets

OTHER PUBLICATIONS

Harris, Daniel C.; "Development of hot-pressed and chemical-vapor-deposited zinc sulfide and zinc selenide in the United States for optical windows"; SPIE, vol. 6545, 2007; 27 pages.

Chlique, C. et al.; A comparative study of ZnS powders sintering by Hot Uniaxial Pressing (HUP) and Spark Plasma Sintering (SPS); Optical Materials; 33; 2011; pp. 706-712.

Mroz and Goldman, "Nanostructured, Infrared-Transparent Magnesium-Aluminate Spinel with Superior Mechanical Properties"; Int. J. Appl. Ceram., Technol. 9 (1); 2012, pp. 83-90.

Cui, Hongtao et al.; "Strategies of Large Scale Synthesis of Monodisperse Nanoparticles"; Recent Patents on Nanotechnology, 2009, 3, pp. 32-41.

Sen, Suranjan et al.; "Fabrication and Characterization of ZnS:Mn Nanoparticles for Spectral Shifting"; Journal of Trends in Chemistry, Jul. 2010, five pages.

John, Rita and Florence, S. Sasi; "Optical, Structural and Morphological Studies of Bean-Like ZnS Nanostructures by Aqueous Chemical Method"; Chalcogenide Letters, vol. 7, No. 4, Apr. 2010, pp. 269-273.

Dumbrava, A. et al.; "Dependence on Grain Size and Morphology of Zinc Sulfide Particles by the Synthesis Route"; Rom. Journ. Phys., vol. 50, Nos. 7-8, 2005, pp. 831-836.

Hu, Jin-Song et al., "Mass Production and High Photocatalytic Activity of ZnS Nanoporous Nanoparticles"; Angew. Chem. Int. Ed., 44, 2005, pp. 1269-1273.

Lu, Hao-Ying et al.; "The characteristics of low-temperature-synthesized ZnS and ZnO nanoparticles"; Journal of Crystal Growth; 269; 2004; pp. 385-391.

Wang, L.P. and Hong, G.Y.; "A new preparation of zinc sulfide nanoparticles by solid-state method at low temperature"; Materials Research Bulletin; 35; 2000, pp. 695-701.

Joo, J. et al.; "Generalized and Facile Synthesis of Semiconducting Metal Sulfide Nanocrystals"; J. Am. Chem. Soc., 125, 2003; pp. 11100-11105.

Sharma, R. et al.; Effect of Molar Concentration on Optical Absorption Spectra of ZnS:Mn Nanoparticles; E-Journal of Chemistry; 7(S1); 2010, pp. S23-S26.

Dumbrava, A. et al.; "Characterization of Zinc Sulfide Nanoparticles by Transmission Electron Microscopy"; Adnan Menderes University, 4th AACD Congress, 2004; Proceedings Book, 276; 3 pages.

Harris, Daniel C.; "Durable 3-6 um transmitting infrared window materials"; Infrared Physics & Technology; 39; 1998; pp. 185-201.

Wang, X. et al.; "Large-scale synthesis well-dispersed ZnS microspheres and their photoluminescence, photocatalysis properties"; Materials Characterization; 59; 2008 pp. 1765-1770.

Wang, W. et al.; Low-Temperature Synthesis of Nearly Monodisperse ZnS Nanospheres Using a Facile Solution-Phase Approach; www.publish.csiro.au/journals; Aust. J. Chem., 59, 2006; pp. 791-795.

Sun, Ji-Quan et al.; Low-temperature synthesis of hexagonal ZnS nanoparticles by a facile microwave-assisted single-source method; Solid State Communications, 147, 2008, pp. 501-504.

Yang, H. et al.; "Microwave-assisted synthesis and luminescent properties of pure and doped ZnS nanoparticles"; Journal of Alloys and Compounds, 402, 2005, pp. 274-277.

Zhao, Y. et al.; "Microwave-assisted self-assembled ZnS nanoballs"; Journal of Crystal Growth, 270, 2004, pp. 438-445.

Panda, S. et al.; "Nearly monodispersed ZnS nanospheres: Synthesis and optical properties"; Chemical Physics Letters, 40, 2007, pp. 235-238.

Hu, H. and Zhang, W.; "Synthesis and properties of transition metals and rare-earth metals doped ZnS nanoparticles"; Optical Materials, 28, 2006, pp. 536-550.

http://www.armymantech.com/pg11.pdf; Feb. 22, 2012; one page.

Haynes, A.; "Low Cost Zinc Sulfide Missile Dome Manufacturing"; U.S. Army AMRDEC; Apr. 21, 2008; 6 pages.

MONODISPERSED AND SPHERICAL ZNS FOR NANO-GRAIN OPTICAL WINDOWS

CROSS-REFERENCE TO RELATED APPLICATION

This application claims the benefit of U.S. provisional application No. 61/464,281 filed Mar. 2, 2011, having the same inventors and the same title, and incorporated herein by reference in its entirety; and also claims the benefit of commonly assigned U.S. Ser. No. 13/371,187 (Ravichandran et al.), entitled "Ultra-High Densification of ZnS For Nano-Grain Optical Windows", which was filed on Feb. 10, 2012, and which is incorporated herein by reference in its entirety.

FIELD OF THE DISCLOSURE

The present application relates generally to the production of materials for infrared optical windows, and more specifically to methods for the densification of ZnS for the production of nano-grain optical windows.

BACKGROUND OF THE DISCLOSURE

Metal sulfide powders such as ZnS are useful as precursors for the optical ceramics used in sensor windows and domes on aircraft, satellites, and missiles. Kodak and others demonstrated the production of zinc sulfide (ZnS) windows years ago by hot pressing ceramic powders. This method was subsequently replaced by a chemical vapor deposition (CVD) process in military applications where cost was not an important consideration. The CVD process is advantageous in that it allows ZnS windows to be fabricated in larger, flat or curved geometries which readily conform to the shape of aircraft.

Optical grade ZnS may be deposited or grown in a fully dense state by the CVD process. The resulting ZnS is polycrystalline and orange in color. Although this CVD-processed ZnS is transparent over a portion (about 0.5 to 12 microns) of the infrared region, it has poor transmittance in the visible region of the spectrum, due to scattering effects. This shortcoming may be addressed by annealing the ZnS. Thus, the transparency of the CVD-processed ZnS may be improved, in both the visible and infrared regions of the electromagnetic spectrum, by subjecting the material to a hot, isostatic press (HIP). The ZnS formed by this process is sometimes referred to as "multispectral" ZnS.

SUMMARY OF THE DISCLOSURE

Figure 1:
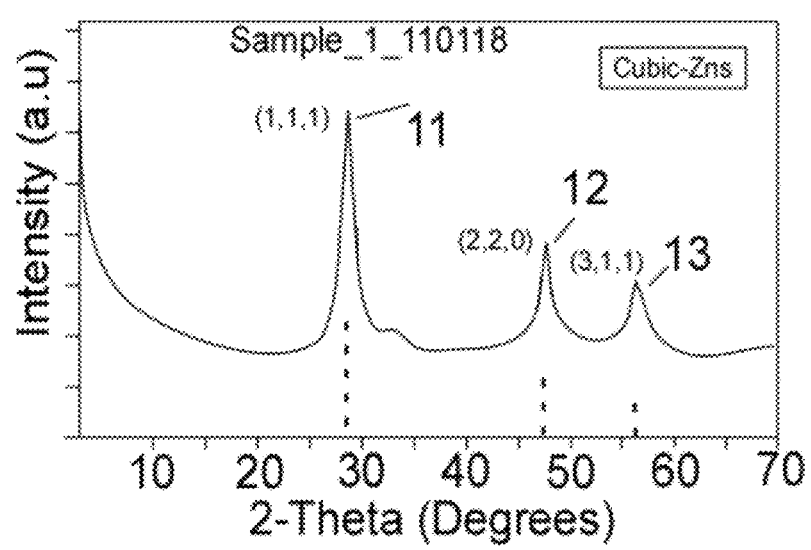
FIG. 1 shows X-ray diffraction peaks for samples of ZnS nanoparticles which were subjected to powder X-ray diffraction (XRD) prior to their use in the methodologies described herein.

In one aspect, a method for producing an article which is transparent to infrared radiation is provided. The method comprises (a) disposing a population of nanoparticles on a substrate, wherein the population of spherical nanoparticles has a population variance of less than 10% in at least one parameter selected from the group consisting of diameter and maximum dimension; (b) subjecting the nanoparticles to spark plasma sintering, thereby producing a sintered product; and (c) removing the sintered product from the substrate as a self-supporting mass.

In another aspect, a method for producing an optical window which is transparent to infrared radiation is provided. The method comprises (a) disposing a population of nanoparticles in a conductive mold, wherein the population of spherical nanoparticles has a population variance of less than 10% in at least one parameter selected from the group consisting of diameter and maximum dimension; (b) subjecting the nanoparticles to spark plasma sintering, thereby producing a sintered product; and (c) removing the sintered product from the mold as a self-supporting article.

In a further aspect, an infrared imaging device which captures infrared images through an optical window is provided. The window comprises a material derived by sintering a population of nanoparticles, wherein the population of spherical nanoparticles has a population variance of less than 10% in at least one parameter selected from the group consisting of diameter and maximum dimension.

In still another aspect, an optical element is provided which comprises a material derived by sintering a population of nanoparticles, wherein the population of spherical nanoparticles has a population variance of less than 10% in at least one parameter selected from the group consisting of diameter and maximum dimension.

In yet another aspect, an article is provided which comprises a self-supporting mass derived by sintering a population of nanoparticles, wherein said self-supporting mass has nano-grains with an average maximum dimension within the range of about 100 nm to about 800 nm, and wherein the population of spherical nanoparticles has a population variance of less than 10% in at least one parameter selected from the group consisting of diameter and maximum dimension.

DETAILED DESCRIPTION

As noted above, the transparency of CVD-processed ZnS may be improved by subjecting the material to a hot, isostatic press (HIP). However, use of the HIP process has at least one significant drawback. In particular, subjecting CVD-processed ZnS to the elevated pressures and temperatures attendant to the HIP process causes grain growth in the material, which has been attributed to the removal of the high temperature (hexagonal) wurtzite phase of ZnS during the anneal. The increase in grain size of the ZnS causes a concomitant reduction in certain mechanical properties of the material, such as mechanical strength. Hence, while the HIP process increases the optical transmission of the material, it also reduces the strength of the material.

As a result of the foregoing, while CVD-processed, HIP-treated ZnS is suitable for many applications, it is not optimal for applications requiring high mechanical strength. One such application is in the optical windows and domes used in the infrared imaging components of missile systems (sometimes referred to as long wave-infrared (LWIR) and semi-active laser domes). In these applications, the window material is required to have high optical transmission in both the visible and infrared regions (and in particular, over a wavelength range of between 0.4 micron and 12 micron) of the electromagnetic spectrum. The material is also required to possess high mechanical strength so that it can, for example, withstand erosion and damage due to the impact of high velocity water droplets, sand, and other particulates.

To date, only a small group of materials are known that have the optical and mechanical properties that make them candidates for this type of application. These materials include zinc sulfide, zinc selenide, germanium, gallium arsenide, gallium phosphide, mercury cadmium telluride and cadmium telluride. Generally, all of the aforementioned materials, as produced by conventional methods in the art, are brittle, have relatively low thermal shock resistance, and have relatively low resistance to erosion and damage due to the impact of high velocity water droplets, sand, and other particulates. Notwithstanding its suboptimal mechanical strength, CVD-processed, HIP-treated ZnS is still the material of choice for this application, mostly for want of better alternatives.

Ternary sulfide materials, such as calcium lanthanum sulfide, are also currently being developed for IR applications, particularly in the 0.5-12 micron region of the spectrum. While these ternary sulfide materials provide some improvement in durability, even these materials are susceptible to deterioration in mechanical stability and optical performance when exposed to the harsh environments required by the imaging domes and windows of a missile.

It has been found that the nature of metal sulfides and other precursor materials has a significant impact on the properties of articles made from optical ceramics. In particular, the use of high purity, monodisperse, nano-scale precursor materials has been found to be especially desirable for creating optical ceramics having excellent thermal, mechanical and optical properties. However, conventional methods of synthesizing metal sulfide powders require high temperatures. The high temperature consolidation attendant to these methods leads to grain growth, which significantly reduces the optical and thermo-mechanical properties of the optical ceramics.

In light of the foregoing, a need exists in the art for materials (and methods for producing the same) which have high mechanical strength and high optical transmission in both the visible and infra-red regions of the electromagnetic spectrum (and in particular, over a wavelength range of between 0.4 microns and 12 microns in the infrared region of the spectrum). In particular, a need exists in the art for materials (and methods for producing the same) which are suitable for use in the windows and domes of missile imaging systems. These and other needs may be met by the materials, methodologies and systems disclosed herein.

It has now been found that the foregoing needs may be addressed through the provision of systems and methodologies which utilize spark plasma sintering (SPS), in conjunction with hot pressing, to produce nano-grain materials. Preferably, the nanoparticle feedstock utilized in this approach comprises spherical nanoparticles, and more preferably, monodisperse spherical nanoparticles (that is, the population of nanoparticles utilized is characterized by a small population variance in diameter or maximum dimension). Such materials may be advantageously produced by the low temperature processes described herein.

Materials may be produced by these systems and methodologies which are preferably based on metal sulfides, metal selenides (such as, for example, ZnS) and other such materials, and which are useful in a variety of applications, including optical polycrystalline ceramic windows. Materials may be produced by these systems and methodologies which have excellent optical transmission in the infrared and visible regions of the spectrum, and which exhibit improved durability compared to similar materials produced by other processes.

For example, materials such as ZnS, which may be based on spherical and monodispersed nanoparticles, may be sintered using the systems and methodologies described herein to produce articles having ultra high densities of nano-grains. These articles may exhibit improved durability and mechanical strength over their CVD-processed, HIP-treated counterparts. Consequently, the systems and methodologies described herein may be utilized to produce materials for the windows and domes of missile imaging systems which have greater resistance to high velocity rain erosion, sand erosion and other environmental factors.

In a preferred embodiment of the SPS method, a conductive mold is filled with a starting powder material and is placed in a vacuum chamber similar to that used in the hot press method. Preferably, the mold comprises graphite. Pressure is applied to the mold from the top and bottom using upper and lower energizing punch electrodes. At the same time, pulsed, direct current is allowed to flow through the mold through the energizing punch electrodes. A power supply for generating pulsed direct current may be utilized which is similar to the power supply used for an electrical discharge machine. The pulsed direct current may be applied at an initial stage of sintering and continuous direct current may be applied thereafter or, alternatively, a continuous pulsed direct current may be applied throughout the sintering.

The foregoing approach increases the temperature of ZnS and other sulfides or selenides, including strontium sulfide (SrS), calcium sulfide (CaS) and lead sulfide (PbS), and produces as a final product high density, nano-grain, polycrystalline materials which are free of pores or voids. This morphology may give rise to enhanced mechanical stability in comparison to similar materials produced by conventional sintering processes.

The systems and methodologies disclosed herein provide a solution to a problem which has been plaguing the art for many years, namely, the production of ZnS having both high mechanical strength and high optical transmission in the visible and infrared portions of the electromagnetic spectrum. This objective is achieved through the use of a novel process that involves spark plasma treatment of ZnS nano-sized crystalline particles under high pressure and temperature, followed by thermal annealing. This process is enhanced by the use therein of spherical, monodisperse nanoparticles, which may be advantageously produced by the low temperature processes described herein.

ZnS nano-sized crystalline particles used in a preferred embodiment of the systems and processes described herein may be produced from homogeneous precipitation methods using starting materials that include a Zn source and a sulfide source. Various materials may be utilized as the Zn source including, but not limited to, Zn metal, zinc acetate, or zinc acetate dehydrate, zinc acetate anhydrous, zinc carbonate, zinc nitrate, zinc nitrate hexahydrate, zinc oxide, zinc chloride, zinc chloride hydrate, zinc hydroxide, zinc citrate hydrate, zinc sulfate heptahydarate and zinc sulfate monohydarate. Various materials may be utilized as the sulfide source including, but not limited to, sulfur, sodium thiosulfate, thioacetamide, thiourea, sodium sulfide, ammonium sulfide, lithium sulfide, potassium sulfide and hydrogen sulfide.

In a representative embodiment of the methodologies disclosed herein, prior to undergoing the spark plasma treatment, samples of ZnS were subjected to powder X-ray diffraction (XRD) and Scanning Electron Microscopy (SEM) analysis to confirm the phase purity of the ZnS and the morphology of the nano-size particles. The powder X-ray diffraction was accomplished by placing the powder samples on a glass slide and subjecting the samples to X-ray analysis. The XRD patterns of ZnS showed the presence of broad reflection peaks indicating nanostructures and corresponding to the cubic "zinc blend" crystal structure.

The X-ray diffraction peaks are shown in FIG. 1. Diffraction peak 11 corresponds to the (1, 1, 1) plane of the cubic crystalline ZnS material. Similarly, peak 12 corresponds to the (2, 2, 0) plane, and peak 13 corresponds to the (3, 1, 1) plane of the cubic crystalline ZnS material. SEM analysis showed spherical particles having diameters within the range of about 30-100 nm. After the phase purity and morphology of the nanoparticles was confirmed, the sample underwent spark plasma treatment as described below.

Figure 2:
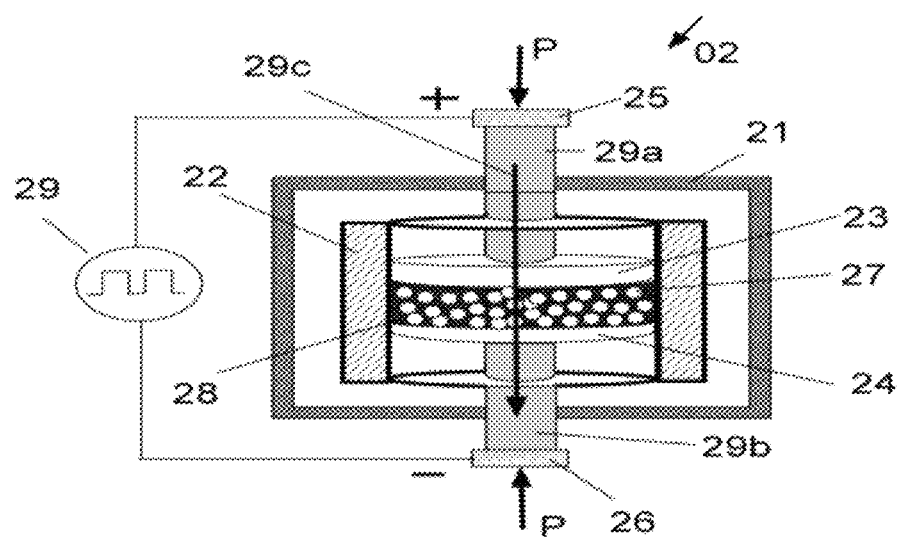
FIG. 2 is an illustration of a typical spark plasma chamber which may be utilized for spark plasma treatment of ZnS and other materials in the methodologies described herein.

The spark plasma chamber used to conduct the spark plasma treatment process is illustrated in FIG. 2. The device includes an outside chamber 21, which contains an inside active plasma chamber 22. The active plasma chamber comprises a top punch 23 and a bottom punch 24. The top punch 23 and the bottom punch 24 are made out of graphite to withstand high temperature. A top punch holder 29a and a bottom punch holder 29b are attached to electrodes 25 and 26, respectively. Electrode 25 serves as the anode, and electrode 26 serves as the cathode. A first electrically conductive path exists which extends from electrode 25 to top punch 23. Similarly, a second electrically conductive path exists which extends from electrode 26 to bottom punch 24.

Electrodes 25 and 26 are connected to a pulse DC current source 29. The space between the top punch 23 and the bottom punch 24, called the active chamber, is filled with crystalline nanoparticles 27 (in this particular example, the nanoparticles 27 are ZnS nanoparticles). A spark plasma 28 is created between the particles intermittently as a result of a pulsating current supplied by the current source 29. The main plasma current 29c flows from the anode 25 to the cathode 26. Pressure P is applied continuously to the top punch 23 and the bottom punch 24 through the punch holder 29a and 29b. The active plasma chamber is kept at a high temperature. For the sake of simplicity, certain elements, such as the heat control and hydraulic pressure mechanisms, have been omitted from FIG. 2.

The nano-size particles of crystalline ZnS were sintered using the spark plasma apparatus shown in FIG. 2. The conditions under which sintering was performed are as follows.

Prior to heating, the active chamber containing the particles was evacuated, and the inside of the active chamber and the space between the chambers 21 and 22 was flushed with argon gas. For the sake of simplicity, the vacuum system, argon injection and heat control systems are not shown in FIG. 2.

The active chamber was heated at a rate of 60° C. to 90° C./min to a temperature in the range of 450° C. to 600° C. A pressure in the range of 70 Pa to 120 Pa was applied between the top punch 23 and bottom punch 24.

The active chamber and the space between the top punch 23 and the bottom punch 24 was further heated to a temperature in the range of 600° C. to 750° C. The pressure applied between the top punch 23 and bottom punch 24 was maintained within the range of range of 70 Pa to 120 Pa. A vacuum of 10 Pa was maintained in the active chamber.

Voltage pulses were applied under these conditions between electrode 25 and electrode 26, thus creating a spark plasma in the spaces between the particles. The plasma current is controlled by the current source 29 which initiated the voltage pulses. This plasma creates filamentary high current density around the particles, causing them to melt and thus resulting in 'grain-welding' or sintering between the particles. Since the spark plasma momentarily creates a high current density around the particles, joule heating at the core of the particles is substantially prevented. This phenomenon inhibits growth of the grain size.

The intermittent spark plasma is maintained for a duration in the range of 1 minute to 5 minutes. The power is turned off after this treatment.

Figure 3:
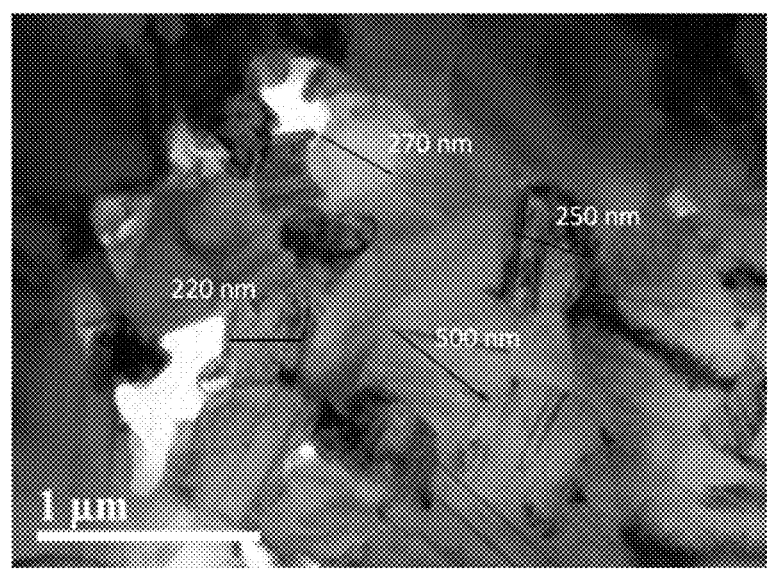
FIG. 3 is a transmission electron micrograph image of ultra-high density of cubic ZnS formed by spark plasma treatment in accordance with the teachings herein.

FIG. 3 shows a transmission electron micrograph (TEM) image of ultra-high density cubic ZnS formed that underwent the spark plasma treatment. Nano-grains ranging from 220 nm to 500 nm can be seen in the micrograph.

Figure 4:
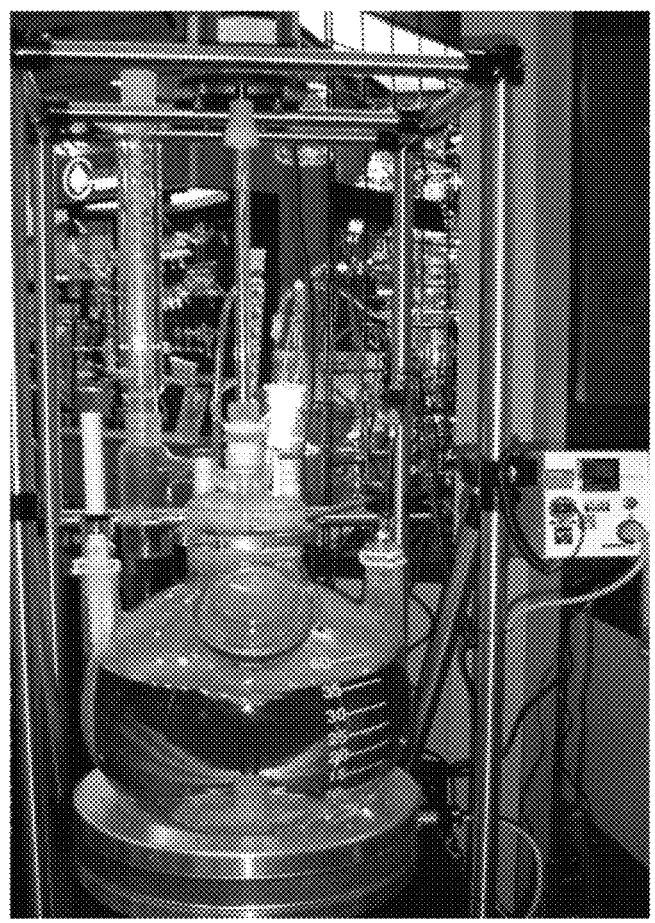
FIG. 4 illustrates an experimental set-up for the production of ZnS spherical nanoparticles in accordance with the teachings herein.

FIG. 4 illustrates an experimental set-up for the large scale production of ZnS spherical nanoparticles in accordance with the teachings herein. The set-up includes a 40 L 3-neck round bottom flask equipped with an inert gas inlet (connected to a supply of high purity argon or nitrogen), a heating mantle, a temperature probe, reactant inlets, and an overhead motor which rotates a stirring rod within the 3-neck round bottom flask. As illustrated below, smaller versions of this set-up may be utilized for the preparation of smaller quantities of nanoparticles.

The following examples illustrate the fabrication of metal sulfide nanoparticles (and zinc sulfide nanoparticles in particular) for use in the articles and methodologies described herein. In each case, the nanoparticles were fabricated using an experimental set-up of the type shown in FIG. 4 except that, owing to the smaller quantities being produced, a 2 L 3-neck round bottom flask was used in place of the 40 L flask depicted.

Example 1

The following example illustrates the solution based synthesis of monodispersed spherical zinc sulfide nanoparticles using zinc chloride and sodium sulfide.

An aqueous solution of zinc chloride was prepared by mixing 27.26 g zinc chloride (obtained commercially from Sigma-Aldrich Chemicals Inc., St. Louis, Mo.) with 750 ml of deionized water. An aqueous solution of sodium sulfide was also prepared by mixing 28.31 g sodium sulfide (obtained commercially from Sigma-Aldrich Chemicals, Inc.) with 750 ml. Both solutions were mixed well and were subjected to ultrasonication (using an ultrasonicator obtained commercially from VWR Scientific products) for 20 minutes.

The pH of the zinc chloride solution was adjusted from 6.15 to within the range of 1.2-5.0. The zinc chloride solution was then placed into the 2 L three-neck round bottom flask and was heated to 50-110° C. in an inert atmosphere consisting of either ultra high purity argon or nitrogen.

A sodium sulfide solution was slowly added dropwise to the zinc chloride solution by means of an addition funnel. After the addition of sodium sulfide solution was complete (after about 20 min), the initially clear solution assumed a light, milky appearance, thus indicating the initial generation of ZnS nanocrystals with dimensions in the range of 5-10 nm. Over time, these small nanocrystals grew into 40 nm spherical monodispersed ZnS particles. The mixture was maintained at 50-110° C.±5° C. for 10-12 hours. The final reaction solution was thick and milky white in color, thus indicating the complete formation of monodispersed ZnS nanocrystals.

The ZnS nanoparticles obtained were separated from the reaction mixture by centrifugation at 5000 rpm for 30 minutes and were washed three times with ultrapure deionized water by successive shaking, followed by an acetone wash and finally an ethanol wash to remove any trace level impurities. The washed ZnS nanoparticles were then dried in a vacuum oven at 65° C. for 6 hours prior to sample analysis.

Example 2

The following example illustrates the solution-based synthesis of monodispersed spherical zinc sulfide nanoparticles using zinc nitrate hexahydrate and thioacetamide.

An aqueous solution of zinc nitrate hexahydrate was prepared by mixing 14 g zinc nitrate hexahydrate (obtained commercially from Sigma-Aldrich Chemicals Inc.) with 200 ml of deionized water. An aqueous solution of thioacetamide was also prepared by mixing 30 g thioacetamide (obtained commercially from Sigma-Aldrich Chemicals, Inc.) with 200 ml deionized water. Both solutions were mixed well and were subjected to ultrasonication (using an ultrasonicator obtained commercially from VWR Scientific products) for 15 minutes.

The pH of the zinc nitrate hexahydrate solution was adjusted to with a range of 1.2-5.0. The pH adjusted zinc nitrate hexahydrate solution was added to the 2 L three neck round bottom flask, and the solution was heated to 50-105° C. in an inert atmosphere consisting of either ultra high purity argon or nitrogen. The thioacetamide solution was then added dropwise to the zinc nitrate hexahydrate solution by means of an addition funnel.

Once addition of the thioacetamide solution was complete after 30 min, the initially clear solution developed a blue tinge, and then a light milky color. The mixture was maintained at 50-105° C.±5° C. for 10-12 hours. The final reaction solution had a thick, milky white color indicative of the complete formation of monodispered ZnS nanocrystals. The ZnS nanoparticles obtained were separated from the reaction mixture by centrifugation at 5000 rpm for 30 minutes. The separated nanoparticles were then washed three times with ultrapure deionized water by successive shaking, followed by an acetone wash and finally an ethanol wash to remove any trace level impurities. The washed ZnS nanoparticles were then dried in a vacuum oven at 65° C. for 5 hours prior to sample analysis.

Example 3

The following example illustrates the solution-based synthesis of monodispersed spherical zinc sulfide nanoparticles using zinc acetate hexahydrate and thioacetamide.

An aqueous solution of zinc acetate hexahydrate was prepared by mixing 52.6 g zinc acetate hexahydrate (obtained commercially from Sigma-Aldrich Chemicals Inc.) with 450 ml of deionized water. An aqueous solution of thioacetamide was also prepared by mixing 23.1 g thioacetamide (obtained commercially from Sigma-Aldrich Chemicals, Inc.) with 450 ml deionized water. Both solutions were mixed well and were subjected to ultrasonication (using an ultrasonicator obtained commercially from VWR Scientific products) for 15 minutes.

The pH of the zinc acetate solution was adjusted from 6.01 to within the range of 1.2-5.0. The pH adjusted zinc acetate solution was added to the 2 L 3-neck flask and was heated to 50-110° C. in an inert atmosphere consisting of either ultra high purity argon or nitrogen, after which the thioacetamide solution was added dropwise to the zinc acetate solution by means of an addition funnel. Once addition of the thioacetamide solution was completed after 15 minutes, the initially clear solution developed a light yellow tint, and then assumed a light milky color. The mixture was maintained at 50-110° C.±5° C. for 10-12 hours. The final reaction solution had a thick milky white color with a yellow tint, which was indicative of the complete formation of spherical ZnS nanocrystals. The ZnS nanoparticles obtained were separated from the reaction mixture by centrifugation at 5000 rpm for 30 minutes, and were washed three times with ultrapure deionized water by successive shaking, followed by an acetone wash and finally by an ethanol wash to remove any trace level impurities. The washed ZnS nanoparticles were dried in a vacuum oven at 65° C. for 5 hours prior to sample analysis.

Example 4

The following example illustrates the solution-based synthesis of monodispersed spherical zinc sulfide nanoparticles using zinc acetate hexahydrate and thiourea.

An aqueous solution of zinc acetate hexahydrate was prepared by mixing 6.6 g zinc acetate hexahydrate (obtained commercially from Sigma-Aldrich Chemicals Inc.) with 400 ml of deionized water. An aqueous solution of thiourea was also prepared by mixing 22.8 g thiourea (obtained commercially from Sigma-Aldrich Chemicals, Inc.) with 400 ml deionized water. Both solutions were mixed well and were subjected to ultrasonication (using an ultrasonicator obtained commercially from VWR Scientific products) for 15 minutes.

The pH of the zinc acetate solution was adjusted from 6.01 to within the range of 1.2-5.0. The pH adjusted zinc acetate solution was added to the 2 L 3-neck round bottom flask and was heated, with stirring, to 80-115° C. in an inert atmosphere consisting of ultra high purity argon or nitrogen. The thiourea solution was added dropwise to the zinc acetate by means of an addition funnel. Once the addition of thiourea solution was complete after 10 minutes, the initially clear solution developed a light blue color, before assuming a light milky color. The mixture was maintained at 80-110° C.±5 C for 10-12 hours. The final reaction solution had a thick, milky white appearance indicative of the complete formation of monodispersed spherical ZnS nanocrystals.

The ZnS nanoparticles obtained were separated from the reaction mixture by centrifugation at 5000 rpm for 30 minutes and were washed three times with ultrapure deionized water by successive shaking, followed by an acetone wash and finally an ethanol wash to remove any trace level impurities. The ZnS nanoparticles so obtained were dried in a vacuum oven at 65° C. for 5 hours prior to sample analysis.

Example 5

The following example details the analysis of the ZnS samples obtained as described above.

Figure 5:
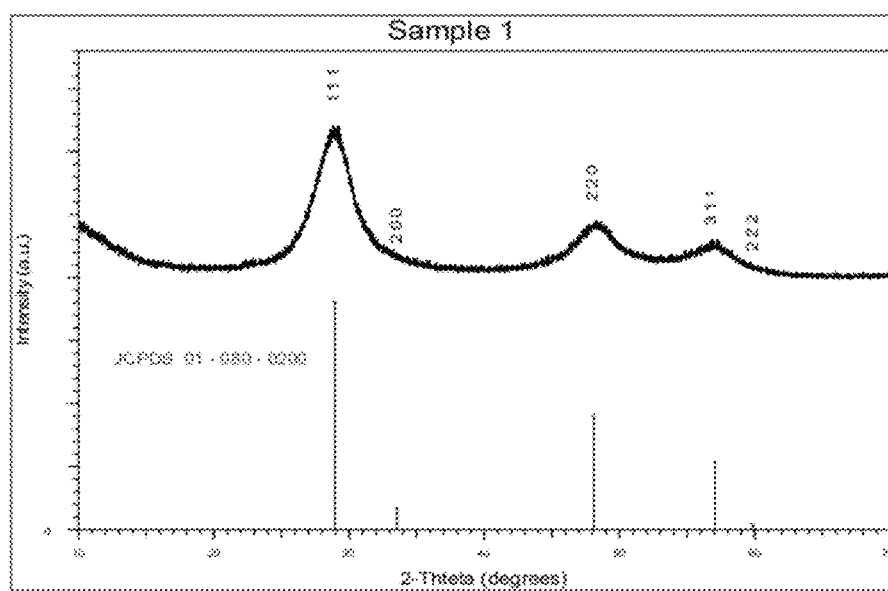
FIG. 5 illustrates a powder X-ray diffraction pattern of phase pure ZnS nanomaterials; broadness in the peaks indicates that the nanomaterials are crystalline in nature.

Samples of ZnS obtained in EXAMPLES 1-4 were subjected to powder X-ray diffraction (XRD) to confirm the phase purity of the ZnS. Powder X-ray diffraction was performed by placing powder samples onto a glass slide and subjecting the samples to X-ray analysis. One of the resulting X-ray diffraction patterns, which is representative of the remaining samples, is shown in FIG. 5. The X-ray diffraction patterns of ZnS show the presence of broad reflection peaks indicating nanostructures, and corresponding to the cubic "zinc blend" crystal structure. The diffraction peak 11 corresponds to the (1, 1, 1) plane of the cubic crystalline ZnS material. Similarly, peak 12 corresponds to the (2, 2, 0) plane, and peak 13 corresponds to the (3, 1, 1) plane of the cubic crystalline ZnS material.

Figure 6:
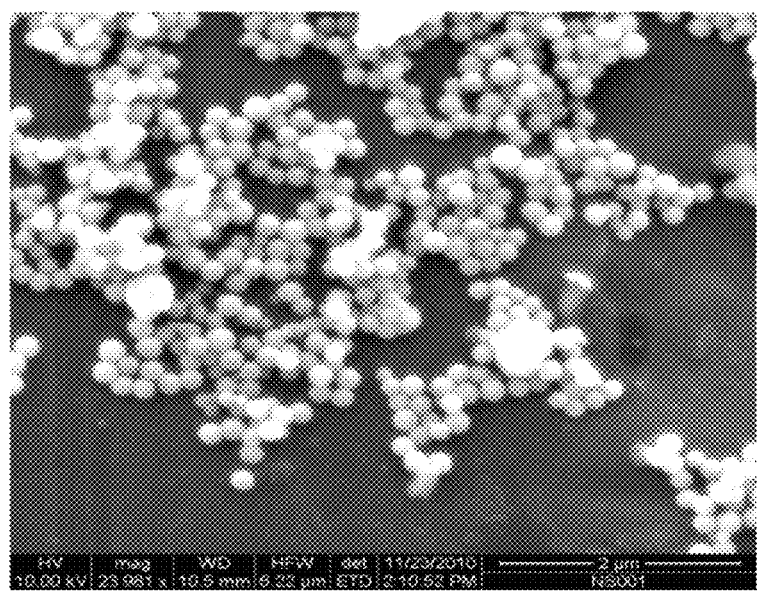
FIG. 6 is an SEM image of monodispersed, spherical ZnS nanoparticles which are about 100 nm in diameter.
Figure 7:
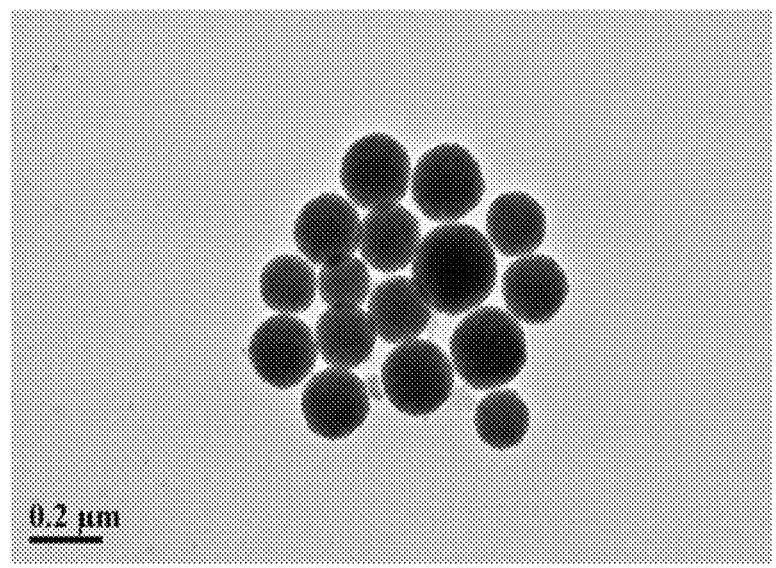
FIG. 7 is a Transmission Electron Microscopy (TEM) image of a sample of monodispersed and spherical ZnS particles.

Scanning Electron Microscopy (SEM) (see FIG. 6) and Transmission Electron Microscopy (TEM) analysis (see FIG. 7) were also performed on the samples to analyze the morphology of the nano-size particles. These techniques show that the samples consist of monodispersed and spherical ZnS nanoparticles.

While the compositions and methodologies disclosed herein have been described and illustrated with respect to specific embodiments, one skilled in the art will recognize that various modifications to these compositions and methodologies are possible without departing from the scope of the teachings herein. For example, while ZnS treated with the spark plasma exhibits high mechanical strength, it may be less optically transmissive than desired. The optical transmission may be improved, both in visible wavelengths as well as in infra-red wavelengths in the range of 0.4 micron and 12 micron, through a suitable thermal annealing step or HIPing method.

While the ultra-high densification of nanoparticles obtained through spark plasma treatment has been described above with reference to its use with ZnS nanoparticles, one skilled in the art will appreciate that this process may be utilized with various other materials. Such materials include, but are not limited to, calcium lanthanum sulfides (e.g., $CaLa_2S_4$), CaS, SrS, PbS, $CaF_2$, $SrF_2$, $ZnF_2$, $Ga_2S_3$, zinc selenide, Gallium phosphide, spinel ($MgAl_2O_4$, Magnesium Aluminum Oxide) and aluminum oxynitride (ALON).

Sintered and annealed ceramic windows made through the use of the systems and methodologies described herein may be supplemented with coatings to further enhance their properties and to provide increased protection. An anti-reflective coating, for example, may be applied to minimize the reflection of infrared radiation and to thereby cause more of the radiation to pass through the window. Examples of coating materials that may be utilized for this purpose include, but are not limited to, low refractive index materials, particularly yttria, silica, magnesium fluoride, calcium fluoride, zinc fluoride, zinc selenide, and hafnium oxide. Multiple antireflective coatings may also be used.

In some applications, a coating that will transmit visible radiation in addition to the infrared radiation may be desired. Examples of coating materials that may be utilized for this purpose include, but are not limited to, leaded glass and zinc selenide. Alternatively, or in addition, coatings for scratch or erosion resistance may be applied, particularly for enhanced protection against rain, blowing sand, and particle impacts in general. Materials with a high damage threshold velocity, such as gallium phosphide, sapphire, spinel, and aluminum oxynitride (ALON), may also be used.

It will be appreciated from the foregoing that the process of ultra-high densification of nanocrystals of ZnS through spark plasma treatment under high pressure and temperature, followed by thermal annealing and HIPing method, may be utilized to obtain ZnS materials which have high mechanical strength and high optical transmission. These materials may be utilized in various articles, including the windows and domes employed in missile systems and in other infra-red imaging and sensing devices. This methodology may also be applied to other materials, including those listed above, and these materials may be utilized in various applications where mechanical strength and optical transmission, and resistance to a hostile environment are desirable.

The discussion above has focused primarily on the production of materials for use in the windows and domes of infrared imaging systems aboard missiles. In this application, these materials may be used to effectively shield the imaging device from the external environment, while providing the desired optical transparency over wavelengths of interest. However, it will be appreciated that the materials produced by the systems and methodologies described herein may be utilized for a variety of other purposes. For example, these materials may be utilized to make a variety of constructs, including various windows and lenses (including, for example, Fresnel lenses). Moreover, these various constructs may be utilized in a variety of end uses such as, for example, IR imaging, security, and surveillance applications. Such constructs may also be used in devices designed for these applications such as, for example, far infrared cameras, far infrared sensors, and thermal imagers.

Nanoparticles of varying dimensions may be utilized in the systems and methodologies disclosed herein. Preferably, these nanoparticles have an average diameter or average maximum dimension within the range of about 10 nm to about 100 nm, more preferably within the range of about 30 nm to about 50 nm, and most preferably within the range of about 35 nm to about 45 nm. While these nanoparticles may have various shapes and morphologies, they are preferably spherical and crystalline or polycrystalline.

Various thermal and barometric profiles may be used in the sintering chamber prior to or during sintering. Preferably, the chamber is heated in at least two steps. In the first step, the chamber is preferably heated to a first temperature at a rate of about 30° C. to about 120° C./min, and more preferably at a rate of about 60° C. to about 90° C./min. The first temperature is preferably in the range of about 450° C. to about 600° C., and more preferably in the range of about 500° C. to about 550° C. During the first step, a pressure is applied to the top and bottom punches of the chamber which is preferably in the range of about 70 Pa to about 120 Pa, and more preferably in the range of about 90 Pa to about 110 Pa.

In the second step, the chamber is preferably heated to a temperature within the range of about 500° C. to about 850° C., more preferably to a temperature within the range of about 600° C. to about 750° C., and most preferably to a temperature within the range of about 650° C. to about 700° C. During the second step, the pressure within the chamber is preferably maintained at a value within the range of about 5 Pa to about 20 Pa, more preferably at a value within the range of about 5 Pa to about 15 Pa, and most preferably at about 10 Pa.

During sintering, the voltage pulses may be applied for various durations to create a spark plasma. Preferably, the voltage pulses are applied for durations within the range of about 30 second to about 10 minutes, and more preferably for durations of about 1 minute to about 5 minutes.

The systems and methodologies described herein may be utilized to produce products having nano-grains of various dimensions. Preferably, these nano-grains have an average maximum dimension within the range of about 100 nm to about 800 nm, more preferably within the range of about 200 nm to about 600 nm, and most preferably within the range of about 220 nm to about 500 nm.

As used herein, the term "population variance", as used in reference to a particular parameter (such as, for example, particle diameter), refers to the statistical variance of that parameter in a population. For example, the population variance may be used herein to describe the statistical variance in such parameters as particle diameter or maximum particle dimension in the population of ZnS nanoparticles which are used to make a sintered optical element in accordance with the teachings herein.

While it may be impractical in some cases to directly measure or determine the population variance of the nanoparticles used to make such an article, this parameter may be readily estimated, to a high degree of accuracy, from the sample variance for a sufficiently large sample size. Sample variance $m_2$ is defined by $$m_2 \equiv \frac{1}{N}\sum_{i=1}^{N}(x_i - m)^2 \quad \text{(EQUATION 1)}$$

where $m=\bar{x}$ is the sample mean, and N is the sample size. The population variance $\mu_2 = \sigma^2$ for a sample with N elements, and for which the population mean is to be estimated from the sample itself, may be estimated by using an unbiased estimator $\hat{\mu}_2$ for $\mu_2$. The unbiased estimator $\hat{\mu}_2$ is given by the k-statistic $k_2$, which is defined by EQUATION 2 below:

$$k_2 = \hat{\mu}_2 = \frac{N}{N-1}m_2 \quad \text{(EQUATION 2)}$$

Hence, the population variance of a parameter (such as, for example, diameter or maximum dimension) in a population of nanoparticles to be used in making an optical device in accordance with the teachings herein may be readily estimated, to a high degree of accuracy, by using EQUATION 1 to determine the sample variance of a sample of sufficient size, and by using the determined sample variance in EQUATION 2 to estimate the population variance of the parameter.

One skilled in the art will appreciate that other methods may be used to estimate or determine the population variance of a parameter if, for example, the population mean has been determined by other methods (e.g., spectroscopically). In some cases, it may be possible to use such methods to directly ascertain or estimate the population variance of the parameter. An explanation of minimum sample sizes required to estimate the population variance of a parameter to a desired degree of accuracy is beyond the scope of this discussion. However, such considerations are well known in the statistical arts, and several methods exist in that art for determining minimum sample sizes required for such purposes.

As previously noted, the compositions and methodologies disclosed herein may be utilized to make articles out of ZnS and other ceramics which exhibit improved physical properties. These improved properties may be measured in a variety of ways. Thus, these articles may exhibit a Knoop hardness, with a 50 g load, which is greater than 235 kg mm$^{-2}$, more preferably greater than 245 kg mm$^{-2}$, and most preferably greater than 255 kg mm$^{-2}$. These articles may exhibit a Vicker's hardness, with a 1 kg load, which is greater than 230 kg mm$^2$, preferably greater than 245 kg mm$^{-2}$, and more preferably greater than 255 kg mm$^2$. These articles may exhibit a Young's Modulus of greater than 75 GPa, preferably greater than 80 GPa, and more preferably greater than 85 GPa. These articles may exhibit a flexural strength, with four point loading, of greater than 103 MPa, preferably greater than 110 MPa, and more preferably greater than 115 MPa. Articles may be made in accordance with the teachings herein which are transparent to ultraviolet radiation. These articles may also be made to be transparent to visible radiation, though in some cases, additional processing may be required. The articles preferably have a minimum transmission over the infrared region of the spectrum of 80%, preferably 90%, more preferably 95%, and most preferably 98%. Similarly, the articles preferably have a minimum transmission over the visible region of the spectrum of 80%, preferably 90%, more preferably 95%, and most preferably 98%. Of course, one skilled in the art will appreciate that these values may vary based on choice of materials and other parameters. Moreover, in some cases, a decrease in these values over one or both of these regions may be tolerated in exchange for improvements in other properties such as, for example, mechanical strength.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. An infrared imaging device which captures infrared images through an optical window, said window comprising a material derived by subjecting a population of spherical nanoparticles to spark plasma sintering, wherein the population of spherical nanoparticles has a population variance of less than 10% in diameter.

2. The infrared imaging device of claim 1, wherein said nanoparticles comprise a material selected from the group consisting of metal sulfides and metal selenides.

3. The infrared imaging device of claim 1, wherein said nanoparticles comprise a metal sulfide selected from the group consisting of zinc sulfide, strontium sulfide, calcium sulfide, lead sulfide, gallium sulfide, and calcium lanthanum sulfides.

4. The infrared imaging device of claim 2, wherein said nanoparticles comprise zinc sulfide.

5. The infrared imaging device of claim 1, wherein said nanoparticles have an average diameter within the range of about 10 nm to about 100 nm.

6. The infrared imaging device of claim 1, wherein said nanoparticles have an average diameter within the range of about 30 nm to about 50 nm.

7. The infrared imaging device of claim 1, wherein said nanoparticles are crystalline nanoparticles.

8. The infrared imaging device of claim 1, wherein said material has nano-grains with an average maximum dimension within the range of about 100 nm to about 800 nm.

9. The infrared imaging device of claim 1, wherein said material has nano-grains with an average maximum dimension within the range of about 220 nm to about 500 nm.

10. The infrared imaging device of claim 1, wherein said material is optically transmissive over the wavelength range of 0.4 microns to 12 microns.

11. The infrared imaging device of claim 1, further comprising:
a first antireflective coating disposed over said material, said antireflective coating comprising a material selected from the group consisting of yttria, silica, magnesium fluoride, calcium fluoride, zinc fluoride, zinc selenide, and hafnium oxide.

12. The infrared imaging device of claim 11, further comprising:
a second antireflective coating disposed over said material, said second antireflective coating comprising a material selected from the group consisting of leaded glass and zinc selenide.

13. The infrared imaging device of claim 1, wherein said imaging device is disposed on a missile, and wherein said window is disposed between said imaging device and the environment external to the body of said missile.

14. The infrared imaging device of claim 1, wherein the population of spherical nanoparticles has a population variance in nanoparticle diameter of less than 5%.

15. The infrared imaging device of claim 1, wherein the population of spherical nanoparticles has a population variance in nanoparticle diameter of less than 1%.

16. The infrared imaging device of claim 1, wherein the population of spherical nanoparticles has a population variance in nanoparticle diameter of less than 3%.

17. The infrared imaging device of claim 1, wherein said material has a Knoop hardness, with a 50 g load, which is greater than 235 kg mm$^{-2}$.

18. The infrared imaging device of claim 1, wherein said material has a Knoop hardness, with a 50 g load, which is greater than 245 kg mm$^{-2}$.

19. The infrared imaging device of claim 1, wherein said material has a Vicker's hardness, with a 1 kg load, which is greater than 245 kg mm$^{-2}$.

20. The infrared imaging device of claim 1, wherein said material has a Young's Modulus of greater than 80 GPa.

\* \* \* \* \*